US007165866B2

(12) United States Patent
Li

(10) Patent No.: US 7,165,866 B2
(45) Date of Patent: Jan. 23, 2007

(54) LIGHT ENHANCED AND HEAT DISSIPATING BULB

(76) Inventor: Chia Mao Li, 235 Chung-Ho Box 8-24, Taipei (TW)

( * ) Notice: Subject to any disclaimer, the term of this patent is extended or adjusted under 35 U.S.C. 154(b) by 177 days.

(21) Appl. No.: 10/978,090

(22) Filed: Nov. 1, 2004

(65) Prior Publication Data

US 2006/0092640 A1 May 4, 2006

(51) Int. Cl.
*F21V 29/00* (2006.01)
*H01L 29/22* (2006.01)

(52) U.S. Cl. ...................... 362/294; 362/373; 362/800; 257/99

(58) Field of Classification Search ................ 362/294, 362/800, 580, 235, 547, 650, 126, 373, 218, 362/345, 264; 361/679, 687, 685, 704, 695–697; 257/99, 81, 84, 712, 717, 722, 720
See application file for complete search history.

(56) References Cited

U.S. PATENT DOCUMENTS 6,045,240 A * 4/2000 Hochstein .................. 362/294
6,511,209 B1 * 1/2003 Chiang ...................... 362/294
6,525,668 B1 * 2/2003 Petrick ...................... 340/473
6,715,900 B1 * 4/2004 Zhang ...................... 362/294
6,787,999 B1 * 9/2004 Stimac et al. ................ 315/51
6,864,513 B1 * 3/2005 Lin et al. ..................... 257/99

* cited by examiner

*Primary Examiner*—Sandra O'Shea
*Assistant Examiner*—Bao Q. Truong

(57) ABSTRACT

A bulb comprises a seat; a plurality of metal heat sink each having two fixing surfaces, one fixing surface being fixed with an light emitting chip; and one end of each metal heat sink being placed into an insulated frame and then being fixed to a supporting surface of a heat conductive base; the metal heat sinks having an effect of absorbing heat energy and then transferring heat to the seat so as to dissipate heat; the metal heat sinks being integrally formed with the bulb base and then being combined to the seat; the heat conductive base having an inclined surface which is advantageous to reflect light from a light emitting diode so as to increase the illumination of the light emitting chip; and a metal adhesive layer being assembled to the supporting surface of the heat conductive base and the fixing surfaces of the metal heat sinks.

14 Claims, 6 Drawing Sheets

Fig. 1 (PRIOR ART)

LIGHT ENHANCED AND HEAT DISSIPATING BULB

FIELD OF THE INVENTION

The present invention relates to bulbs, and particularly to a light enhanced and heat dissipating bulb, wherein a plurality of metal heat sinks are installed with respective chips and are accumulated on a supporting surface of a single heat conductive base so that the light is concentrated into one beam. Only one bulb can achieve a desired illumination so that material is saved.

BACKGROUND OF THE INVENTION

Referring to FIG. 1, a perspective view of a prior art bulb 1 is illustrated. The prior art bulb is formed by a seat 11, a bulb base 12, a light emitting diode 14, and a lampshade 13. The seat 11 is installed with a circuit board therein. When the circuit board is conducive, heat will generate so as to have a high temperature. However high temperature will induce errors in operation. The bulb base 12 is a sealing body. A backside of the bulb base has a via hole 15. The via hole 15 is used for dissipating heat. In the prior art, the size of the via hole 15 is very small. Furthermore, in the prior art, bulb is made of plastics which is not a preferred heat dissipation object so that heat in the bulb can not be dissipated fully. Thereby there are too many light emitting diodes 14 are installed so that generated heat can not be completely dissipated. As a result, heat will affect the light emission so that the illumination is low.

Thus, in the prior art light emitting diode has a small volume, short light time and low power so that it is used as indicators, or displays, or auxiliary brake lights or traffic signals or traffic lights. In general, the prior art LEDs are bad in heat dissipation so that only a small power is generated. If it is desired to enlarge the size of the LEDs, the cost will increase. Moreover, LED lights use metal as support and for dissipating heat, but it is not sufficient. As a result, heat accumulated will burn the chips of the bulb and package of the bulb so as to reduce the illumination of the bulb to reduce the lifetime of the bulb.

SUMMARY OF THE INVENTION

Accordingly, the primary object of the present invention is to provide a light enhanced and heat dissipating bulb, wherein a plurality of metal heat sinks are installed with respective chips and are accumulated on a supporting surface of a single heat conductive base so that the light is concentrated into one beam. Only one bulb can achieve a desired illumination so that material is saved.

Moreover, the heat energy is dissipated out through the metal heat sinks, the heat conductive base, bulb base or heat dissipater so as to dissipate heat from the light emitting chip rapidly so that the volume of the bulb is small, and heat can be dissipated rapidly and the lifetime of is long.

Furthermore, the heat from the chip can be dissipated rapidly so that the chip can suffer from a larger electric power.

To achieve above object, the present invention provide a light enhanced and heat dissipating bulb which comprises a seat; a plurality of metal heat sink each having two fixing surfaces, one fixing surface being fixed with an light emitting chip; and one end of each metal heat sink being placed into an insulated frame and then being fixed to a supporting surface of a heat conductive base; the metal heat sinks having an effect of absorbing heat energy and then transferring heat to the seat so as to dissipate heat; the metal heat sinks being integrally formed with the bulb base and then being combined to the seat; the heat conductive base having an inclined surface which is advantageous to reflect light from a light emitting diode so as to increase the illumination of the light emitting chip; and a metal adhesive layer being assembled to the supporting surface of the heat conductive base and the fixing surfaces of the metal heat sinks.

DETAILED DESCRIPTION OF THE INVENTION

Figure 1:
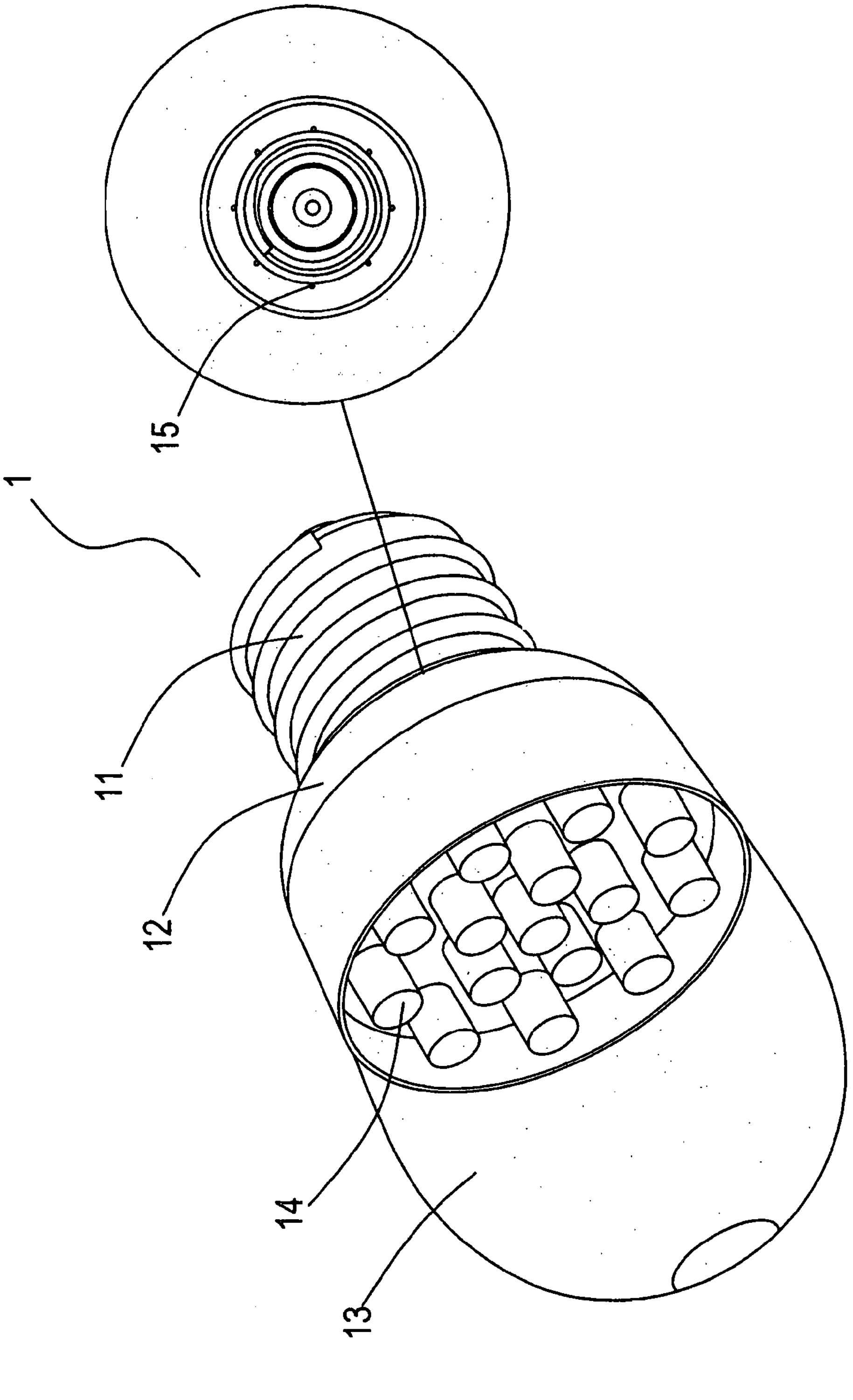
FIG. 1 is a schematic view of the prior art bulb.

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

A bulb comprises a seat; a plurality of metal heat sink 26 each having two fixing surfaces, one fixing surface being fixed with an infrared chip; and one end of each metal heat sink 26 being placed into an insulated frame 25 and then being fixed to a supporting surface 241 of a heat conductive base 24; the metal heat sinks 26 having an effect of absorbing heat energy and then transferring heat to the seat so as to dissipate heat ;a heat conductive base 24 having the supporting surface 241 for fixing the metal heat sinks 26; the metal heat sinks 26 being integrally formed with the bulb base 22 and then being combined to the seat; the heat conductive base 24 is a tin surface and having an inclined surface which is advantageous to reflect light from a light emitting diode so as to increase the illumination of the infrared chip; the heat conductive base 24 being capable of absorbing heat energy from the metal heat sinks 26; and a metal adhesive layer being assembled to the supporting surface 241 of the heat conductive base 24 and the fixing surfaces of the metal heat sinks 26.

The bulb has a power source of light emitting diodes (such as an infrared light emitting diodes). Each fixing surface is a light dispersing plane or a light focus concave surface which is suitable as a searchlight or an infrared light source.

In the present invention, the metal heat sink 26 may be a copper post, or the material of the metal heat sink 26 is selected from one of gold, silver, copper, and aluminum of high heat conductivity. In the present invention, the shape of each metal heat sink 26 is selected from one of round shapes, rectangular shapes, and irregular shapes.

Moreover, the heat conductive base 24 may have, for example, a trapezoidal structure made of aluminum. A smooth inclined plane is formed at a periphery of the heat conductive base 24. The inclined plane has the effect of the refraction of light emitting diode so as to increase the illumination of the bulb.

Furthermore, in the present invention, each metal heat sink 26 is placed in an insulated 25 and then is fixed to the supporting surface 241 of the heat conductive base 24 so as to match the requirement of different power. Or the material of the heat conductive base 24 is selected from gold, silver, copper and aluminum of high heat conductivity.

Furthermore, the heat conductive base 24 is an independent body as a mechanical connection and then the heat conductive base 24 is combined with a heat dissipating device. The heat conductive base 24 is a structure as an outlook of the bulb. An interior of the heat conductive base 24 has a recess for receiving power wires of the bulb.

Figure 2:
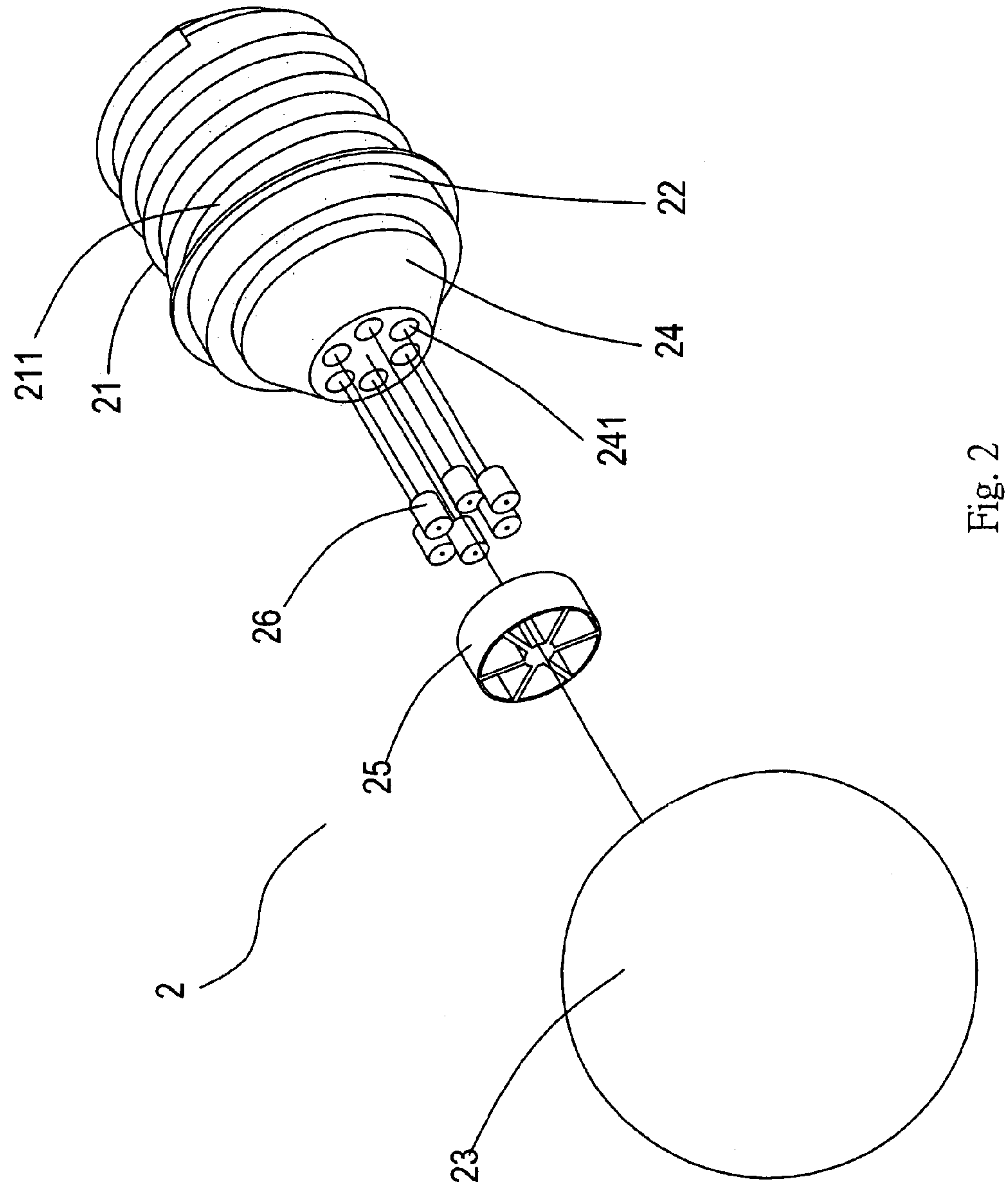
FIG. 2 is an assembled perspective view of the bulb of the present invention.
Figure 3:
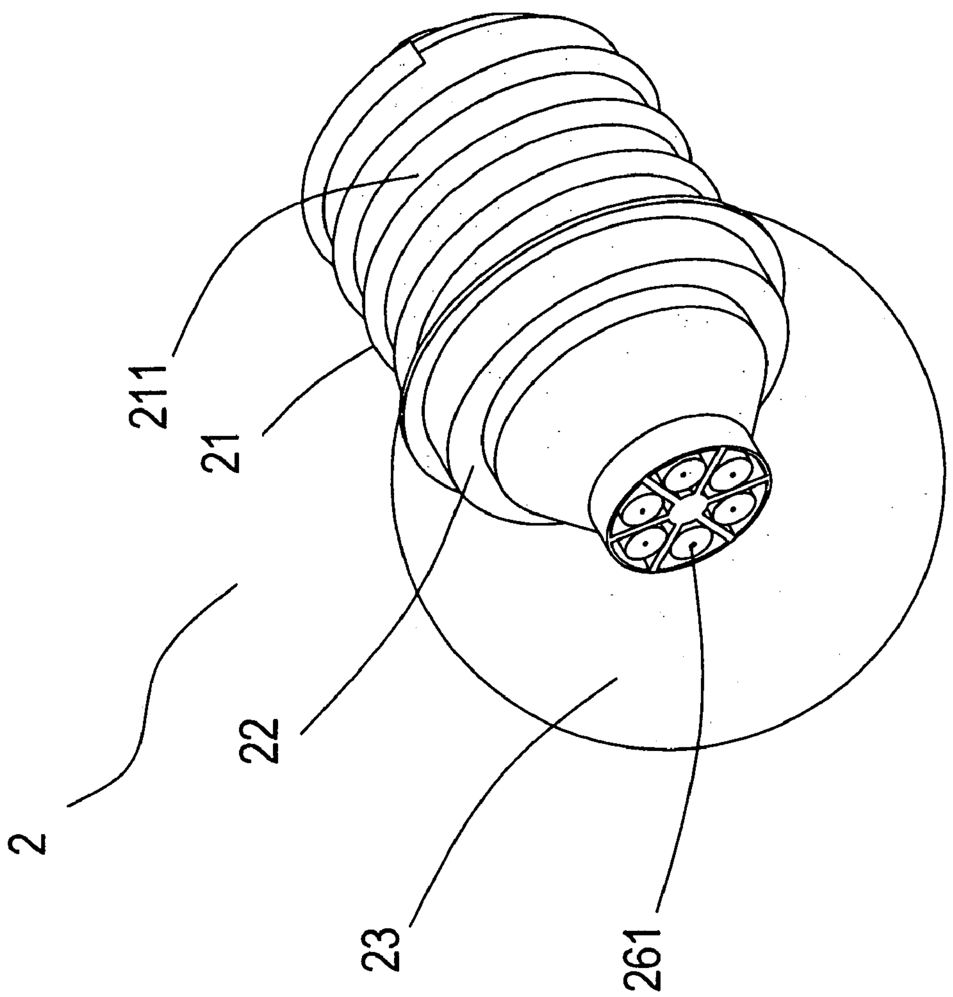
FIG. 3 is a schematic cross view of the bulb of the present invention.
Figure 4:
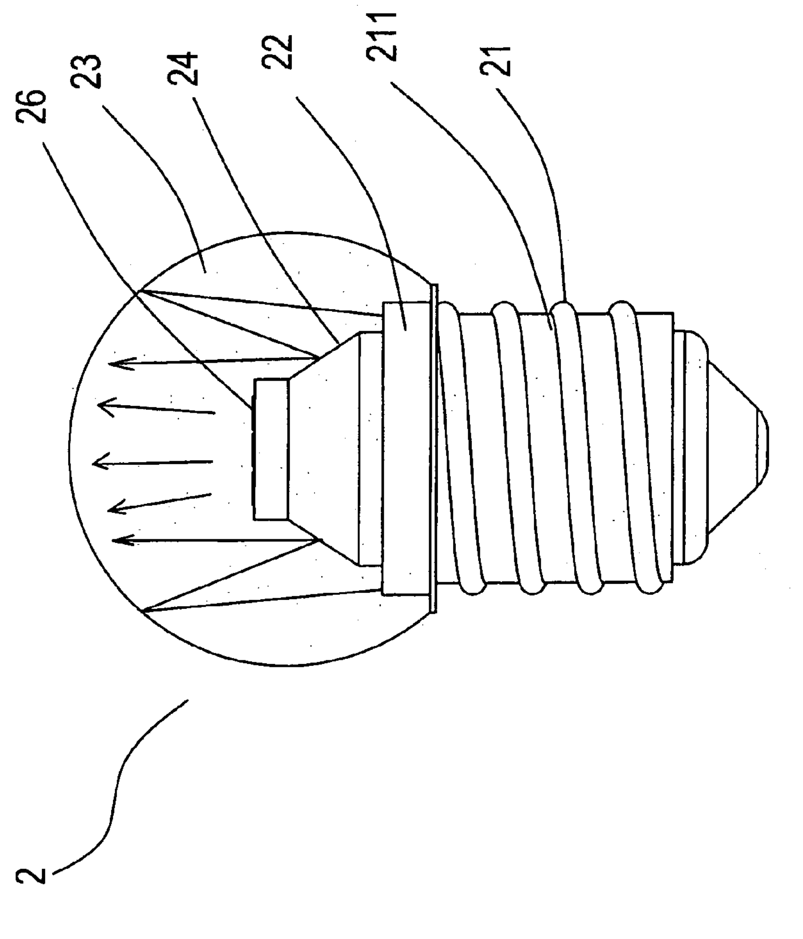
FIG. 4 is a schematic cross view about the bulb of the present invention.

With reference to FIGS. 2, 3 and 4, the exploded perspective view, assembled perspective view and schematic cross view of the present invention are illustrated.

The bulb 2 of the present invention includes a seat 21, a bulb base 22, a heat conductive base 24, a supporting surface 241, a plurality of metal heat sinks 26, an insulated frame 25 and a lampshade 23. A periphery of the seat 21 is installed with a screw thread 2 11. Many kinds of screws matching the requirement of the seat 21 are suitable as the thread 211. A front end of the seat 21 is installed with a bulb base 22. An upper side of the bulb base 22 is installed with a heat conductive base 24. A front end of the heat conductive base 24 has a smaller plane as a supporting surface 241. An upper side of the supporting surface 241 is installed with a plurality of metal heat sinks 26. Each metal heat sink 26 contains a chip 261. An insulating (tame 25 serves to space the metal heat sinks 26 for positioning the clamping tightly the frame 25. A volume of the heat conductive base 24 is larger than mat the metal heat sink 26. The heat conductive base 24 is a preferred heat conductor and a preferred heat dissipating device. When the light emitting chip 261 emits heat, the heat conductive bases 24 will absorb the heat rapidly. Then the heat is transferred to the heat conductive base 24 and the heat dissipater 27 for reducing heat energy of the metal beat sinks 26 so that the heat conductive base 24 and the metal heat sinks 26 can be cooled. Thereby the heat energy of the chip can be diffused to the air effectively and rapidly. When it is desired to have higher illumination, the number of the metal heat sinks 26 must be increased and the area of the supporting surface 241 is expanded. At this state, the heat from the light emitting chip 261 is very high, the heat conductive base 24 can not dissipate heat energy. Thereby the bulb base 22 can be replaced by a heat dissipater 27 according to the light power. A periphery of the heat dissipater 27 is formed with a via hole 271 so as to dissipate heat of the chip 261 effectively and rapidly.

Figure 5:
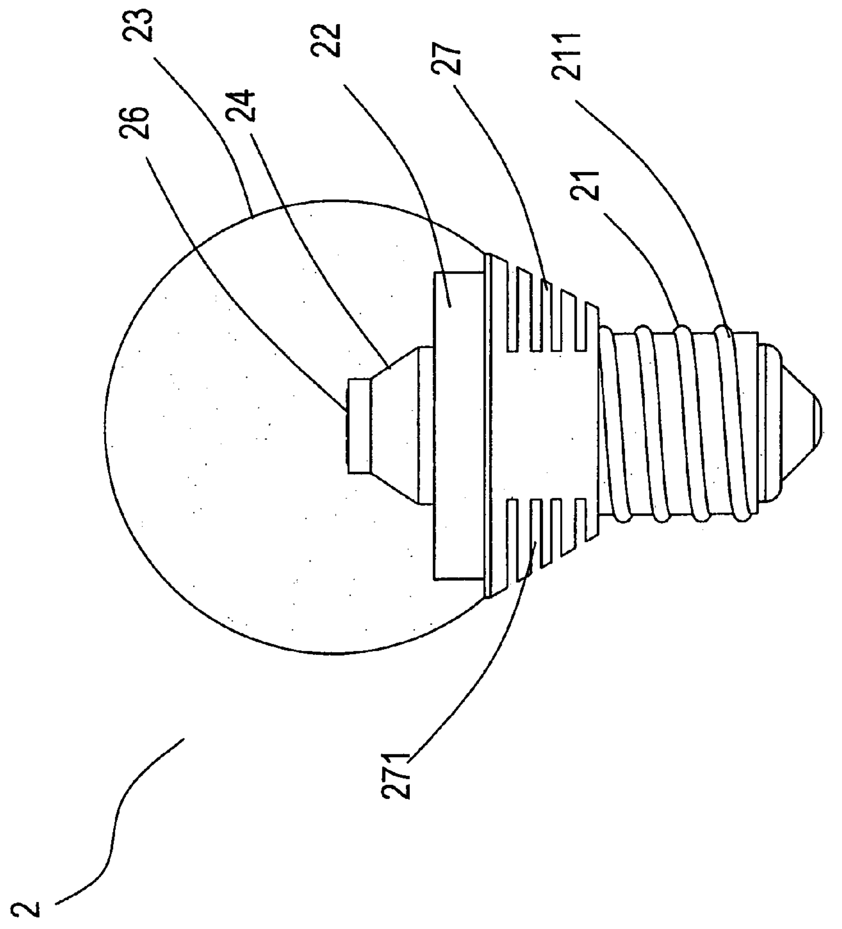
FIG. 5 is a schematic view about the bulb of the present invention.
Figure 6:
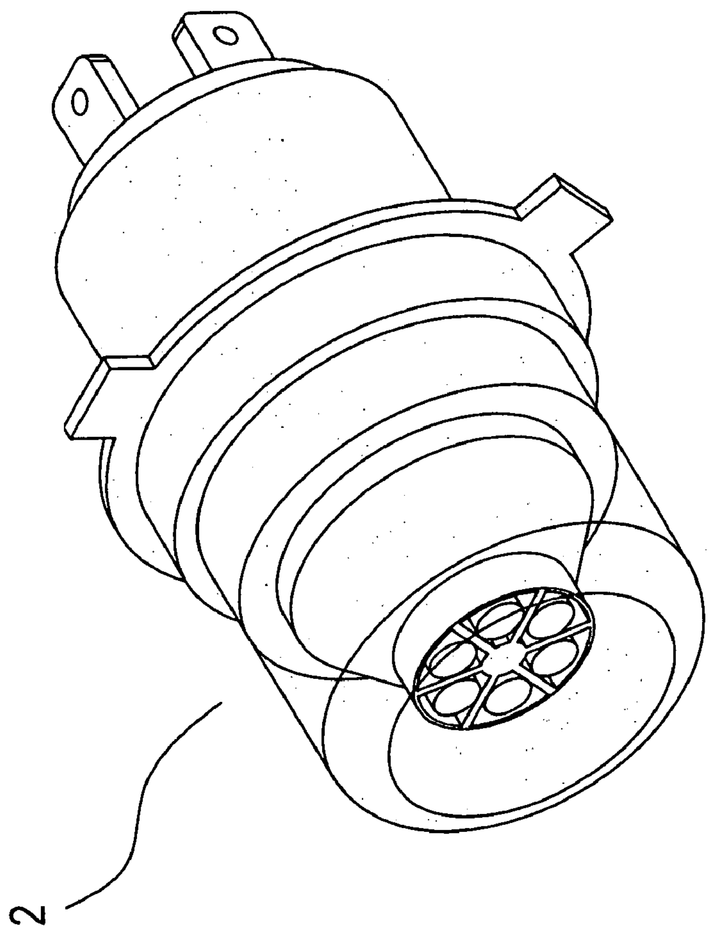
FIG. 6 is a second schematic view about the bulb of the present invention.

FIGS. 5 and 6 shows that the present invention is used with a bulb seat (FIG. 5) and a casing (FIG. 6).

Advantages of the present invention will be described herein. In the present invention, a plurality of metal heat sinks are installed with respective chips and are accumulated on a supporting surface 241 of a single heat conductive base 24 so that the light is concentrated into one beam. Only one bulb 2 can achieve a desired illumination so that material is saved.

Moreover, the heat energy is dissipated out through the metal heat sinks 26, the heat conductive base 24, bulb base 22 or heat dissipater 27 so as to dissipate heat from the light emitting chip rapidly so that the volume of the bulb 2 is small, and heat can be dissipated rapidly and the lifetime of is long.

Furthermore, the heat from the chip can be dissipated rapidly so that the chip can suffer from a larger electric power.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A bulb comprising:

a seat;

a plurality of metal heat sinks each having two fixing surfaces, one fixing surface being fixed with a light emitting chip; and one end of each metal heat sink being placed into an insulated frame and then being fixed to a supporting surface of a heat conductive base; the metal heat sinks having an effect of absorbing heat energy and then transferring heat to the seat so us to dissipate heat;

the heat conductive base having the supporting surface for fixing the metal heat sinks; the metal heat sinks being integrally formed with a bulb base and then being combined to the seat; the heat conductive base is a tin surface and having an inclined surface for reflecting light from the light emitting chip so as to increase the illumination of the light emitting chip; the heat conductive base being capable of absorbing heat energy from the metal heat sinks; and a metal adhesive layer being assembled to the supporting surface of the heat conductive base and the fixing surfaces of the metal heat sinks.

2. The bulb as claimed in claim 1, wherein each fixing surface is one of a light dispersing plane and a light focus concave surface.

3. The bulb as claimed in claim 1, wherein a material of the metal heat sink is selected from one of gold, silver, copper, aluminum of high heat conductivity.

4. The bulb as claimed in claim 1, wherein the shape of each metal heat sink is selected from one of round shapes, rectangular shapes, and irregular shapes.

5. The bulb as claimed in claim 1, wherein each metal heat sink is placed in an insulated frame and then is fixed to the supporting surface of the heat conductive base so as to match the requirement of different power.

6. The bulb as claimed in claim 2, wherein the material of the heat conductive base is selected from gold, silver, copper and aluminum of high heat conductivity.

7. The bulb as claimed in claim 1, wherein the heat conductive base is an independent body as a mechanical connection and then the heat conductive base is combined with a heat dissipating device.

8. The bulb as claimed in claim 1, wherein the heat conductive base is a structure as an outlook of the bulb.

9. The bulb as claimed in claim 1, wherein a heat dissipater is placed between the heat conductive base and the bulb base for dissipating heat from the heat conductive base.

10. The bulb as claimed in claim 9, wherein the heat dissipater is made of metal and has a via hole at a periphery thereof.

11. The bulb as claimed in claim 1, wherein an interior of the heat conductive base has a recess for receiving power wires of the bulb.

12. The bulb as claimed in claim 1, wherein a periphery of the bulb base is installed with a lampshade.

13. The bulb as claimed in claim 1, wherein the light emitting chip is light emitting diodes.

14. The bulb as claimed in claim 1, wherein the light emitting chip is an infrared chip.

* * * * *